United States Patent
O'Meara et al.

(10) Patent No.: US 7,235,440 B2
(45) Date of Patent: Jun. 26, 2007

(54) FORMATION OF ULTRA-THIN OXIDE LAYERS BY SELF-LIMITING INTERFACIAL OXIDATION

(75) Inventors: David L O'Meara, Poughkeepsie, NY (US); Cory Wajda, Mesa, AZ (US); Anthony Dip, Cedar Creek, TX (US); Michael Toeller, Austin, TX (US); Toshihara Furukawa, Essex Junction, VT (US); Kristen Scheer, Milton, NY (US); Alessandro Callegari, Yorktown Heights, NY (US); Fred Buehrer, Poughquag, NY (US); Sufi Zafar, Briarcliff Manor, NY (US); Evgeni Gousev, Mahopac, NY (US); Anthony Chou, Beacon, NY (US); Paul Higgins, Harriman, NY (US)

(73) Assignees: Tokyo Electron Limited, Tokyo (JP); International Business Machines Corporation, Armonk, NY (US)

( * ) Notice: Subject to any disclaimer, the term of this patent is extended or adjusted under 35 U.S.C. 154(b) by 133 days.

(21) Appl. No.: 10/630,969

(22) Filed: Jul. 31, 2003

(65) Prior Publication Data

US 2005/0026453 A1 Feb. 3, 2005

(51) Int. Cl.
*H01L 21/8242* (2006.01)

(52) U.S. Cl. .................. 438/240; 438/216; 438/287; 438/591

(58) Field of Classification Search ............... 438/240, 438/216, 287, 591
See application file for complete search history.

(56) References Cited

U.S. PATENT DOCUMENTS

| | | | |
|---|---|---|---|
| 5,264,396 A | 11/1993 | Thakur et al. | |
| 5,296,412 A | 3/1994 | Ohsawa | |
| 5,334,281 A | 8/1994 | Doerre et al. | |
| 5,817,581 A | 10/1998 | Bayer et al. | |
| 6,090,723 A | 7/2000 | Thakur et al. | |
| 6,197,641 B1 | 3/2001 | Hergenrother et al. | |
| 6,245,616 B1 * | 6/2001 | Buchanan et al. | 438/287 |
| 6,258,731 B1 | 7/2001 | Ando | |
| 6,261,934 B1 * | 7/2001 | Kraft et al. | 438/592 |
| 6,444,592 B1 * | 9/2002 | Ballantine et al. | 438/770 |
| 6,498,097 B1 * | 12/2002 | Park et al. | 438/686 |
| 6,716,695 B1 * | 4/2004 | Hattangady et al. | 438/240 |
| 2001/0031562 A1 | 10/2001 | Raaijmakers et al. | |
| 2002/0102859 A1 | 8/2002 | Yoo | |
| 2002/0111001 A1 | 8/2002 | Ahn et al. | |

OTHER PUBLICATIONS

Liu, H.I. et al., "Self limiting oxidation for fabricating sub-5nm silicon nanowires," Appl. Phys. Letter, American Institute of Physics, vol. 64 ( No. 11), p. 1383-1385, ( Mar. 11, 1994).

(Continued)

*Primary Examiner*—Dung A. Le
(74) *Attorney, Agent, or Firm*—Pillsbury Winthrop Shaw Pittman LLP

(57) ABSTRACT

Ultra-thin oxide layers are formed utilizing low pressure processing to achieve self-limiting oxidation of substrates and provide ultra-thin oxide. The substrates to be processed can contain an initial dielectric layer such as an oxide layer, an oxynitride layer, a nitride layer, a high-k layer, or alternatively can lack an initial dielectric layer. The processing can be carried out using a batch type process chamber or, alternatively, using a single-wafer process chamber. One embodiment of the invention provides self-limiting oxidation of Si-substrates that results in $SiO_2$ layers with a thickness of about 15 A, where the thickness of the $SiO_2$ layers varies less than about 1 A over the substrates.

12 Claims, 9 Drawing Sheets

OTHER PUBLICATIONS

Liu, H.I. et al., "Self-limiting oxidation of Si nanowires," J.Vac. Sc. Technol. B, American Vacuum Society, vol. 11 ( No. 6), p. 2532-2537, (Nov./Dec. 1993).

Fukuda, Hiroshi et al., "Fabrication of silicon nanopillars containing polycrystalline silicon/insulator multilayer structures," Appl. Phys. Lett., American Institute of Physics, vol. 70 ( No. 3), p. 333-335, (Jan. 20, 1997).

Roy, P.K., "Gate Dielectrics," p. 276-289.

J. Derrien, "SiO2 Ultra Thin Film Growth Kinetics as Investigated by Surface Techniques," Surface Science, North-Holland Publishing Company, pp. 32-46, ( Jun. 1982).

C. Raisin et al., "Work Function Measurements During Growth of Ultra Thin Films of SiO2 on Characterized Silicon Surfaces," Solid-State Electronics, Pergamon Press Ltd., vol. 27 ( No. 5), pp. 413-417, ( May 1984).

Mahisha Kundu et al., "Effect of oxygen pressure on the structure and thermal stability of ultrathin Al2O3 films on Si (001)," Journal of Applied Physics, American Institute of Physics, vol. 91 ( No. 1), pp. 492-500, ( Jan. 1, 2002).

* cited by examiner

FORMATION OF ULTRA-THIN OXIDE LAYERS BY SELF-LIMITING INTERFACIAL OXIDATION

FIELD OF THE INVENTION

The present invention relates to semiconductor processing, and more particularly, to a method for forming uniform ultra-thin oxide layers.

BACKGROUND OF THE INVENTION

Thin oxide (e.g., $SiO_2$) and oxynitride (e.g., $SiO_xN_y$) layers are often used as dielectric layers at the Si surface of an integrated circuit. This is in part because of excellent electrical properties of the oxide and oxynitride layers, including high electron mobility and low electron trap densities. Semiconductor transistor technology is currently requiring oxide and oxynitride gate dielectric layers for conventional gate dielectric applications that are less than about 10-15 angstrom (A) thick, or as thin as 5-7 A for use as interface layers with high-dielectric constant materials (also referred to herein as high-k materials).

A native oxide layer that is typically a few angstrom thick, forms easily on clean Si surfaces, even at room temperature and atmospheric pressure. An oxide layer with a desired thickness that is larger than the native oxide thickness, can be grown through the native oxide layer, but usually the thickness uniformity and quality of the oxide layer is poor across the entire Si substrate.

Alternatively, the native oxide (or the chemical oxide) can be removed from Si surface prior to growing a new oxide layer. The native oxide layer can, for example, be removed using liquid baths containing dilute hydrofluoric acid (HF) or by using HF gas phase etching. A new oxide layer can then be re-grown on the clean Si surface by conventional thermal oxidation, but the initial oxidation can proceed quickly and result in poor thickness uniformity and inadequate electrical properties. For ultra-thin (<20 A) oxide layers used in transistor technologies, the leakage current is dominated by the tunneling current.

SUMMARY OF THE INVENTION

A method is provided for forming ultra-thin oxide layers for gate dielectric applications, and other applications, such as dielectric interface layers underneath high-k materials. The method utilizes low processing pressure (and/or low partial pressure of an oxygen-containing gas) to achieve self-limiting oxidation of substrates that results in ultra-thin oxide layers.

In one embodiment of the invention, the substrates to be processed can be clean and lack an initial dielectric layer. Self-limiting oxidation of the substrates results in formation of ultra-thin oxide layers on the substrate.

In another embodiment of the invention, the substrates to be processed can contain an initial dielectric layer comprising at least one of an oxide layer, an oxynitride layer, a nitride layer, and a high-k layer. The initial dielectric layer is used to control the growth of ultra-thin oxide layers that are formed between the initial dielectric layer and the substrate in a self-limiting oxidation of the substrates.

DETAILED DESCRIPTION OF THE INVENTION

A method is provided for forming ultra-thin oxide dielectric layers. These dielectric layers find use in semiconductor microstructures, for example, as gate dielectrics and as dielectric interface layers located between high-k materials and the underlying substrates. The method is capable of achieving ultra-thin layers, which can be of the order of few angstrom.

Figure 1A:
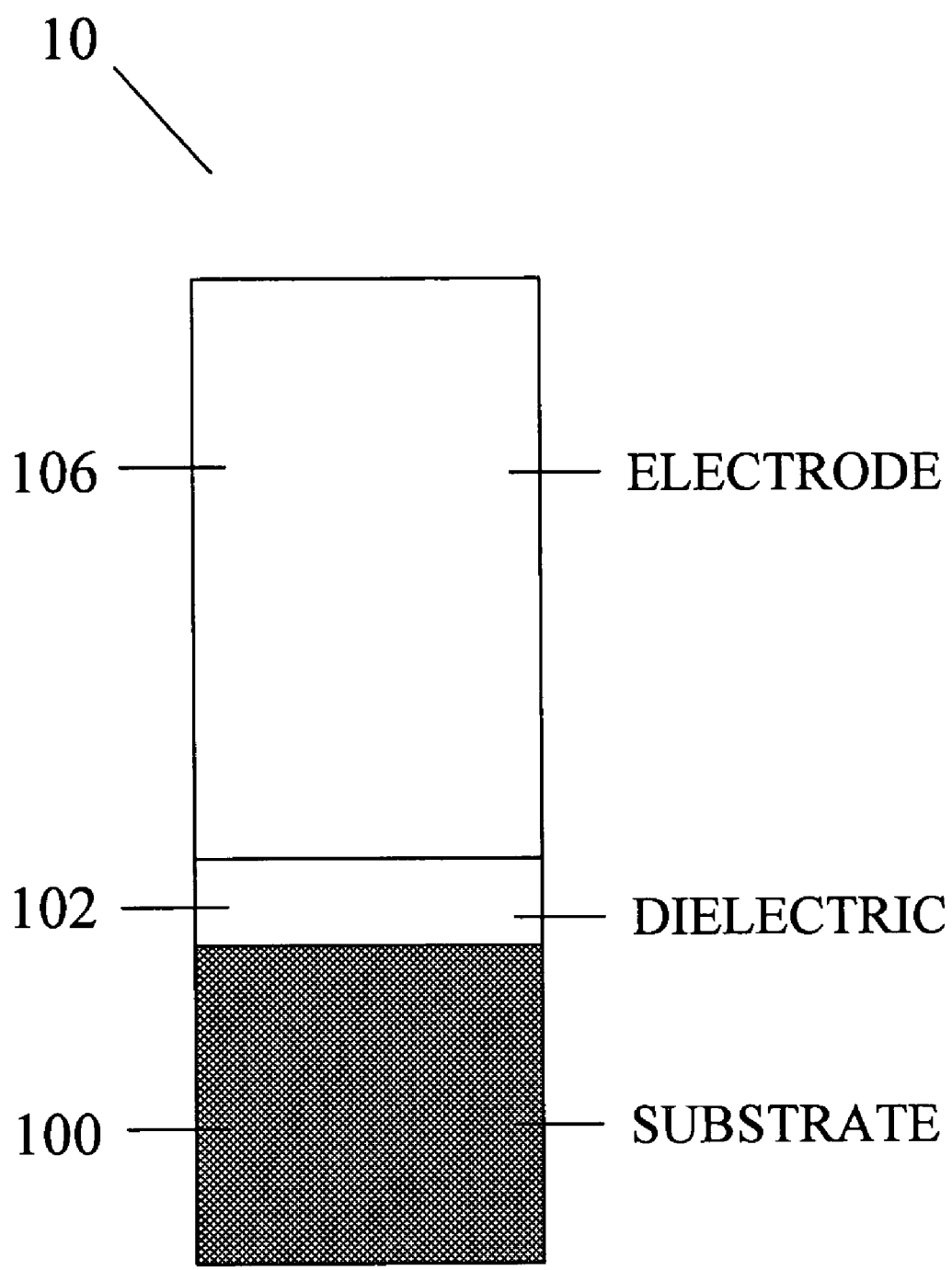
FIG. 1A schematically shows a cross-sectional view of a gate electrode microstructure.

FIG. 1A schematically shows a cross-sectional view of a gate electrode microstructure. The gate electrode microstructure 10, which can be a part of an integrated circuit, comprises a substrate 100, a dielectric layer 102, and an electrode layer 106. The substrate 100 can, for example, be a Si substrate that is single-crystal Si or polycrystalline-Si (poly-Si). A Si substrate can include numerous active devices and/or isolation regions (not shown). A Si substrate 100 can be of n- or p-type, depending on the type of device being formed, and can, for example, consist of any diameter substrate, such as a substrate with a diameter greater than about 195 mm, e.g., a 200 mm substrate, a 300 mm substrate, or an even larger substrate.

The dielectric layer 102 overlying the substrate 100 can, for example, be an ultra-thin (less than about 20 A) oxide layer. It should be noted that the term "oxide" includes oxidized materials containing oxygen that are typically used in semiconductor applications. Such materials include, for example, Si, that forms a $SiO_2$ dielectric layer upon oxidation. An oxide layer can be formed used thermal oxidation of the substrate in the presence of a process gas that includes an oxygen-containing gas, e.g., $O_2$.

Alternatively, the dielectric layer 102 can further contain at least one of an oxynitride layer, a nitride layer, and a high-k layer. Dielectric materials featuring a dielectric constant greater than that of $SiO_2$ (k~3.9) are commonly referred to as high-k materials. In addition, high-k materials may refer to dielectric materials that are deposited onto substrates rather than grown on the surface of the substrate (e.g., $SiO_2$, $SiO_xN_y$). The high-k layer can, for example, be selected from one of $HfO_2$, $ZrO_2$, $Ta_2O_5$, $TiO_2$, $Al_2O_3$, and HfSiO. In addition to the traditional doped poly-Si, the electrode layer 106 can, for example, comprise at least one of W, Al, TaN, TaSiN, HfN, HfSiN, TiN, TiSiN, Re, Ru, and SiGe.

In current semiconductor devices, one function of oxide gate dielectric layers is to "gate" the electrons, by controlling the flow of electricity across the transistor. With the introduction of high-k materials, these layers will likely still be required at the channel and/or gate electrode to preserve interface state characteristics. This includes forming an interface with good electrical properties, preventing uncontrolled Si surface oxidation, reducing reactions between different layers, and acting as a barrier layer to prevent diffusion of atoms to the different layers (e.g., dopant penetration from the gate electrode 106 into the substrate 100). In practice, good device performance depends on controlling the thickness of the dielectric layer 102, such that it remains thin, thereby avoiding increasing the equivalent oxide thickness (EOT) of the gate electrode structure.

Figure 1B:
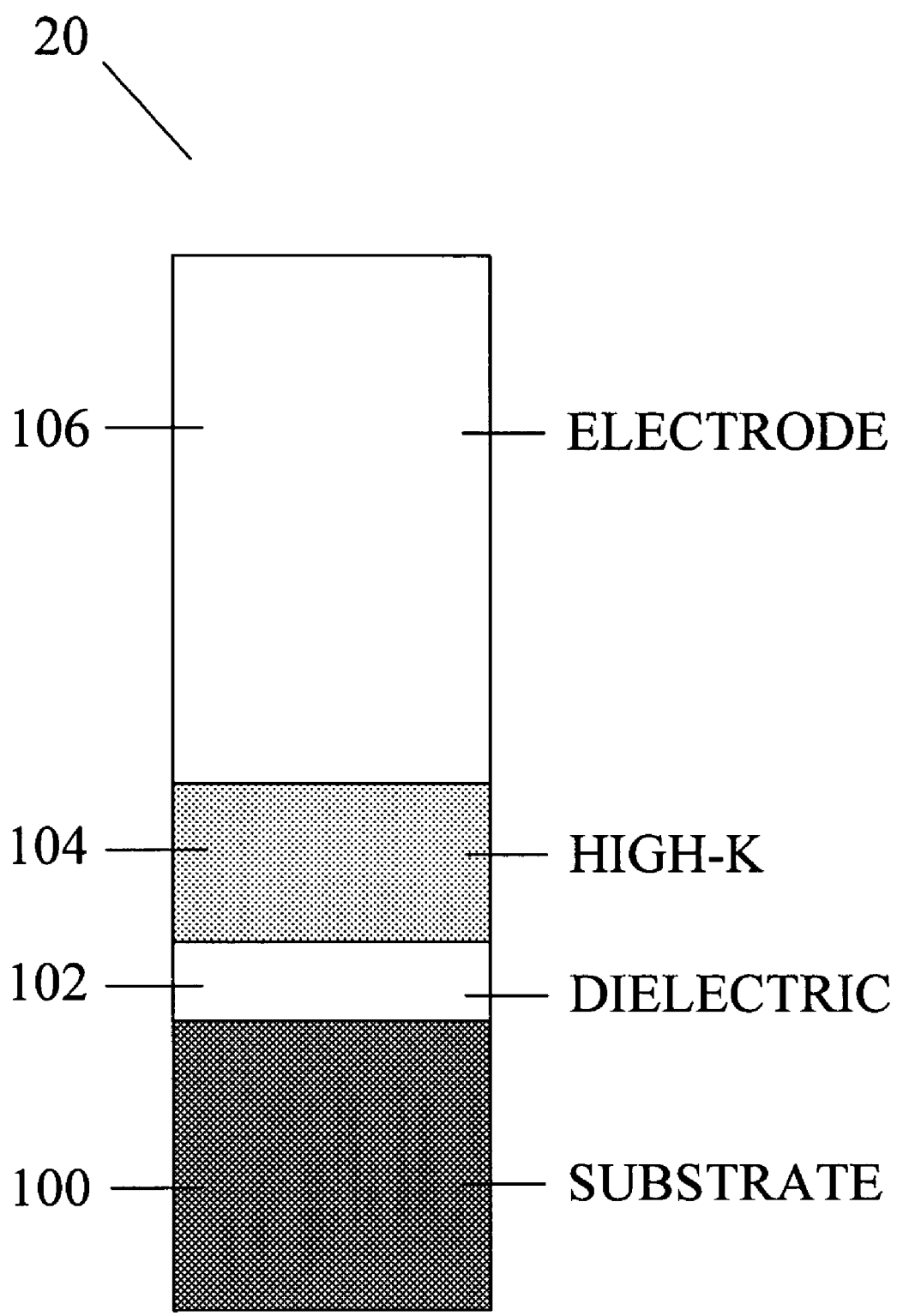
FIG. 1B schematically shows a cross-sectional view of an alternate gate electrode microstructure.
Figure 2A:
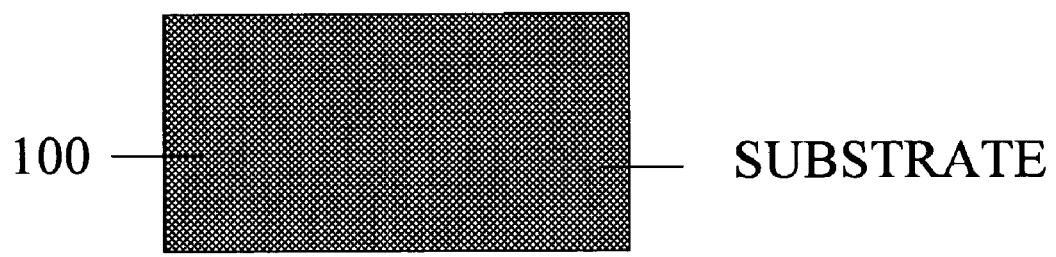
FIG. 2A schematically shows a cross-sectional view of a clean substrate.
Figure 2B:
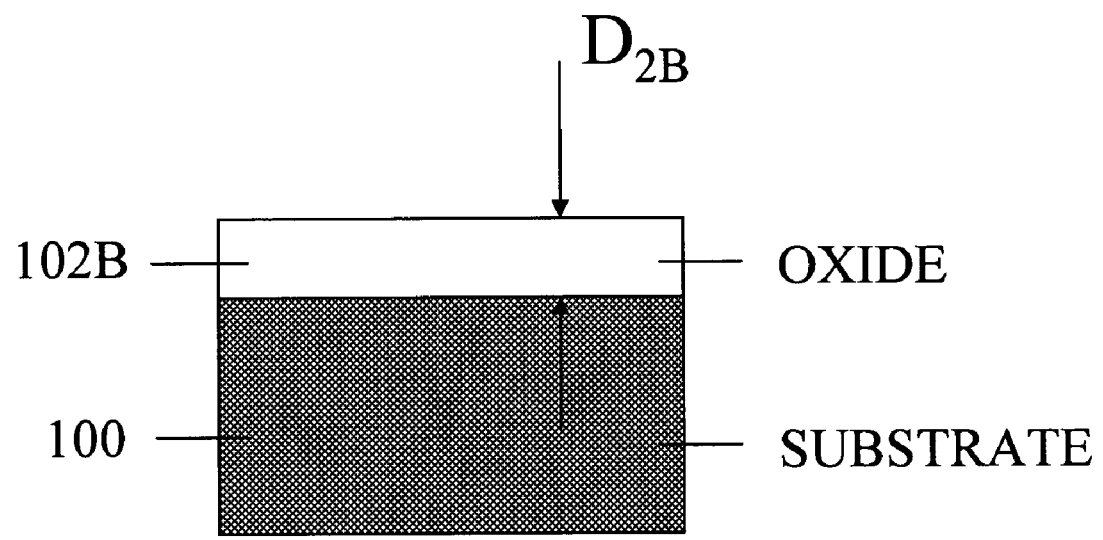
FIG. 2B schematically shows a cross-sectional view of an oxide layer grown by a self-limiting process according to an embodiment of the present invention.

FIG. 1B schematically shows a cross-sectional view of an alternate gate electrode microstructure. The gate electrode microstructure 20 in FIG. 1B differs from the gate electrode microstructure in FIG. 1A by a relatively thick high-k layer 104 that is located between the electrode layer 106 and the dielectric layer 102. The high-k layer 104 in the gate electrode structure 20 can be physically thicker than the dielectric layer 102, while attaining the necessary capacitance FIG. 2A schematically shows a cross-sectional view of a clean substrate. A clean substrate is a substrate that does not have an oxide layer. A substrate can be cleaned, for example, by placing it in a liquid bath containing dilute hydrofluoric acid (HF) or, alternatively, exposing it to HF gas phase etching. The dilute HF liquid solution can be a $H_2O$:HF (e.g., 50:1) mixture. Following the HF cleaning process, the substrate can be rinsed in de-ionized (D.I.) water prior to the oxidation process. A new ultra-thin oxide layer can be grown on the clean surface by a self-limiting process, where the oxide growth rate (and the resulting final oxide layer thickness) can be carefully controlled by selecting the appropriate process conditions, such as the partial pressure of the oxygen-containing gas in the process gas and in the process chamber, and the substrate temperature. FIG. 2B schematically shows a cross-sectional view of an oxide layer grown by a self-limiting process according to an embodiment of the present invention. The oxide layer 102B has a thickness $D_{2B}$ that is uniform over the whole substrate 100.

Suitable process conditions that enable self-limiting growth of an oxide layer with a desired thickness and thickness uniformity can be determined by direct experimentation and/or design of experiments (DOE). For example, adjustable process parameters can comprise time, temperature (e.g., substrate temperature), process pressure, and composition of the process gas.

Figure 3:
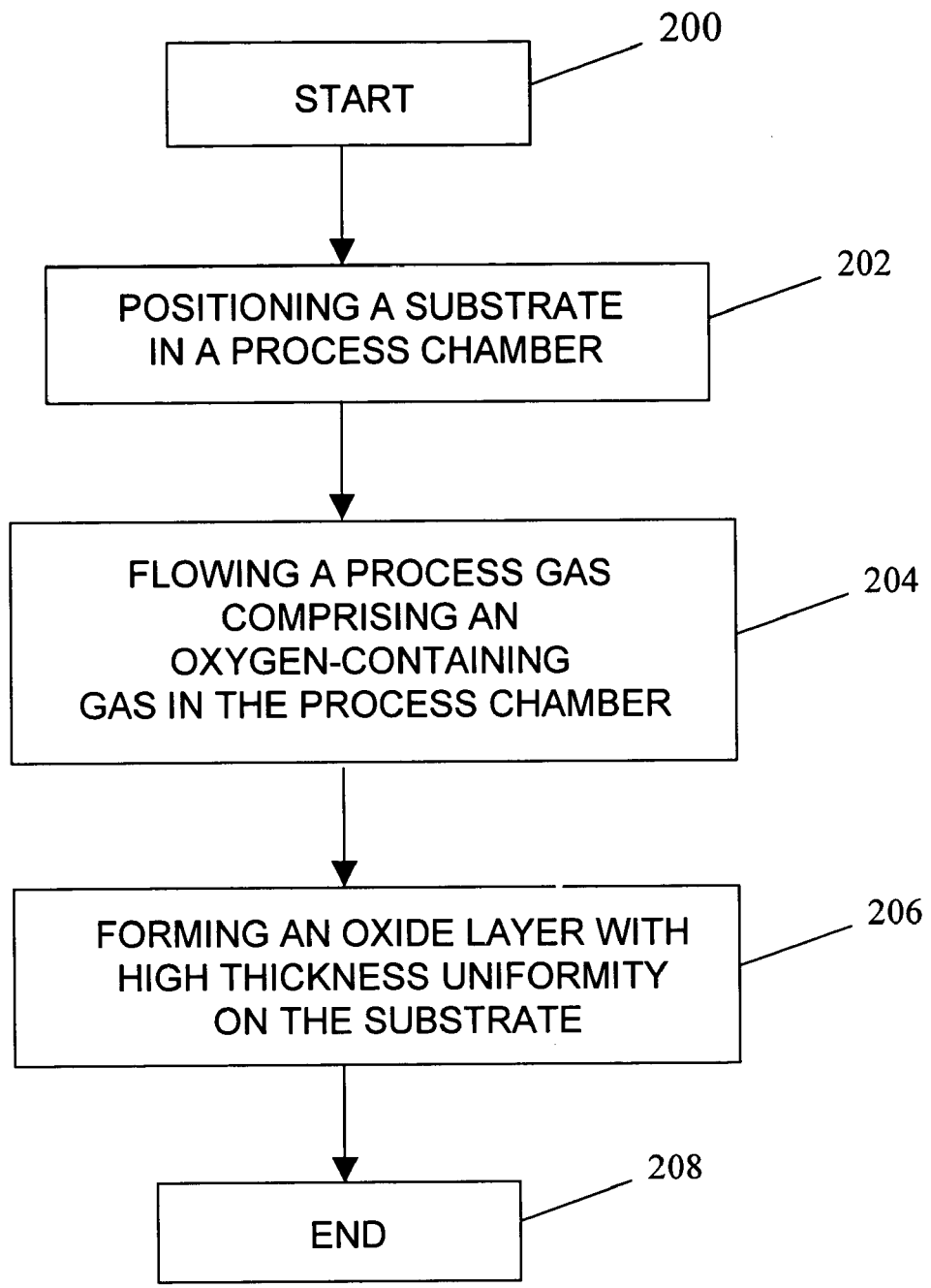
FIG. 3 shows a flowchart for forming an oxide layer according to an embodiment of the invention.

FIG. 3 shows a flowchart for forming an oxide layer according to an embodiment of the invention. At 200, the process is started. At 202, a substrate is positioned in a process chamber, and the chamber is evacuated. Following process chamber evacuation, organic contamination was effectively removed from the substrates at a process chamber temperature of about 300° C. in an ambient containing about 1% oxygen. In addition, several pump/purge cycles were performed using an inert gas. At 204, a process gas including an oxygen-containing gas is flowed into the process chamber. The partial pressure of the oxygen-containing gas can be less than about 50 Torr. Alternatively, the partial pressure of the oxygen containing gas can be less than about 40 Torr. The substrate temperature can be between about 500° C. and about 1000° C., for example, about 700° C. The process chamber pressure can be lower than atmospheric pressure. In fact, the process chamber pressure can be lower than about 50 Torr. The thickness uniformity of the oxide layer can vary less than about 1 Å over the substrate. At 206, an oxide layer with uniform thickness is formed on the substrate in a self-limiting oxidation process. The thickness of the oxide layer can be less than about 15 Å. In fact, it can be less than about 10 Å. The substrate is processed for a time period that enables formation of the desired oxide layer, and the process ends at step 208.

Figure 4A:
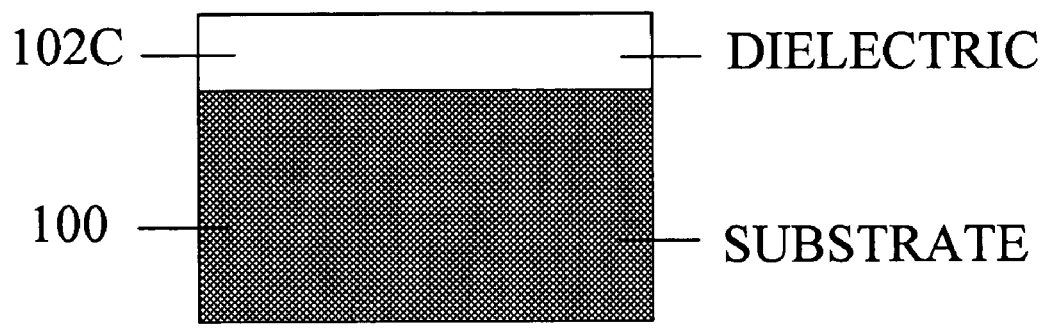
FIG. 4A schematically shows a cross-sectional view of a dielectric layer overlying a substrate.

FIG. 4A schematically shows a cross-sectional view of a dielectric layer overlying a substrate. The initial dielectric layer 102C can, for example, comprise at least one of an oxide layer (e.g., $SiO_2$), a nitride layer (e.g., SiN), an oxynitride layer (e.g., $SiO_xN_y$), or a high-k layer, that can be deposited onto the Si substrate and is typically a few angstrom thick.

Figure 4B:
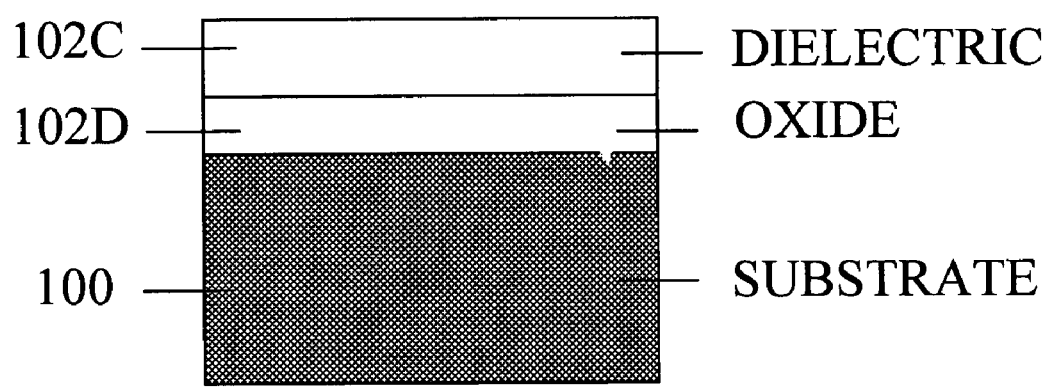
FIG. 4B schematically shows a cross-sectional view of an oxide layer grown by a self-limiting process according to another embodiment of the invention.

FIG. 4B schematically shows a cross-sectional view of an oxide layer grown by a self-limiting process according to an alternate embodiment of the invention. The initial dielectric layer 102C in FIG. 4A is used to control the growth of an oxide layer 102D at the Si interface, where the thickness of the oxide layer 102D is controlled by a self-limiting oxidation of the Si substrate through the dielectric layer 102C. The initial dielectric layer 102C itself can be formed by a self-limiting oxidation process.

Figure 5A:
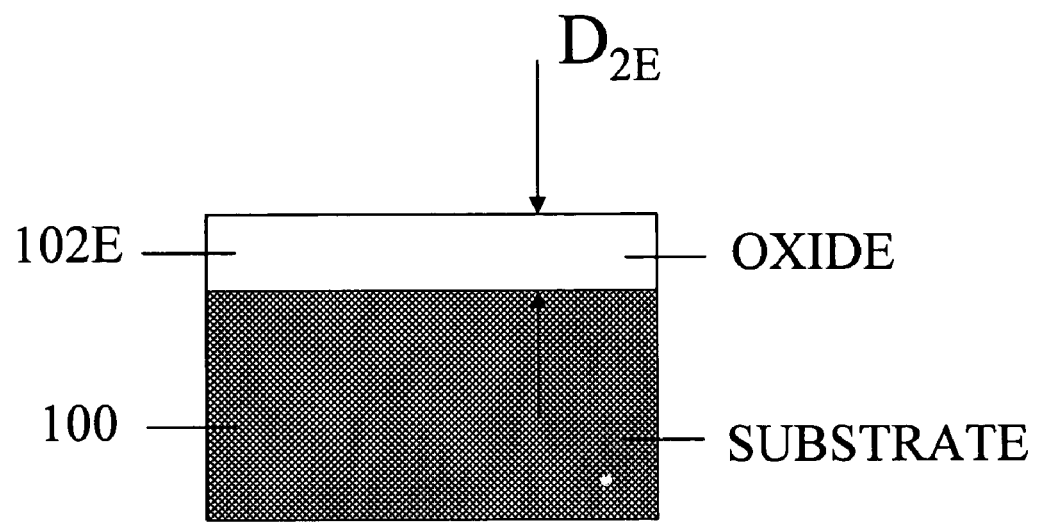
FIG. 5A schematically shows a cross-sectional view of an oxide layer overlying a substrate.

FIG. 5A schematically shows a cross-sectional view of an oxide layer overlying a substrate. The initial oxide layer 102E has a thickness $D_{2E}$ and can, for example, consist of an ultra-thin native oxide layer that is typically a few angstrom thick, and forms easily on surfaces of various clean substrates (e.g., Si), even at room temperature and atmospheric pressure. Alternatively, the ultra-thin oxide layer can be a chemically deposited oxide layer. The initial oxide layer 102E can provide a starting oxide layer for growing a thicker oxide layer.

Figure 5B:
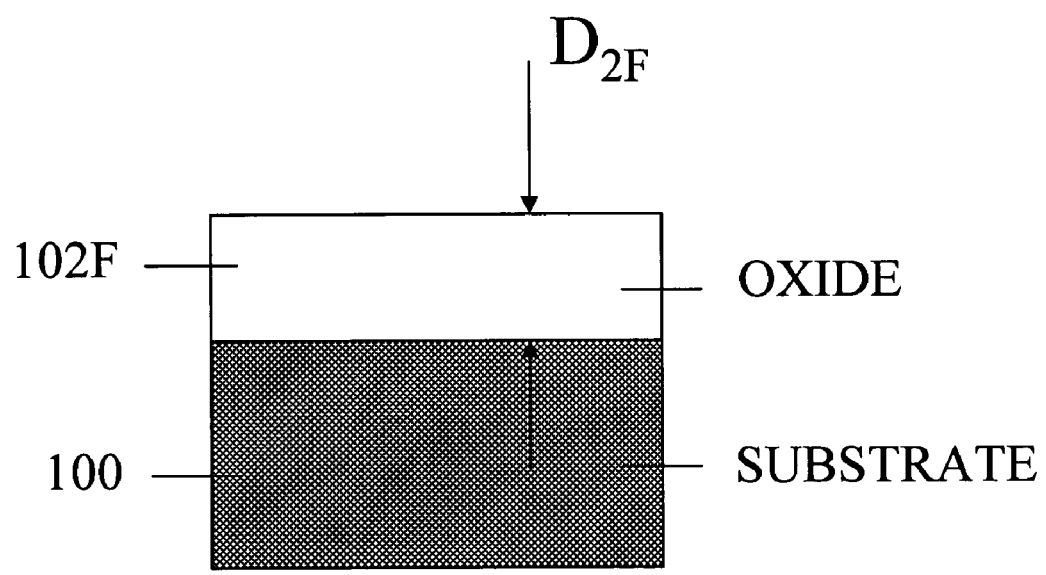
FIG. 5B schematically shows a cross-sectional view of an oxide layer grown by a self-limiting process according to another embodiment of the invention.

FIG. 5B schematically shows a cross-sectional view of an oxide layer grown by a self-limiting process in accordance with an alternate embodiment of the invention. The thickness $D_{2E}$ of the oxide layer 102E in FIG. 5A is less than the thickness $D_{2F}$ of the oxide layer 102F. Importantly, due to the self-limiting growth mechanism of the oxide layer 102F, it is not necessary for the initial oxide layer 102E to have good thickness uniformity, in order to grow an oxide layer 102F with good thickness uniformity.

Figure 6:
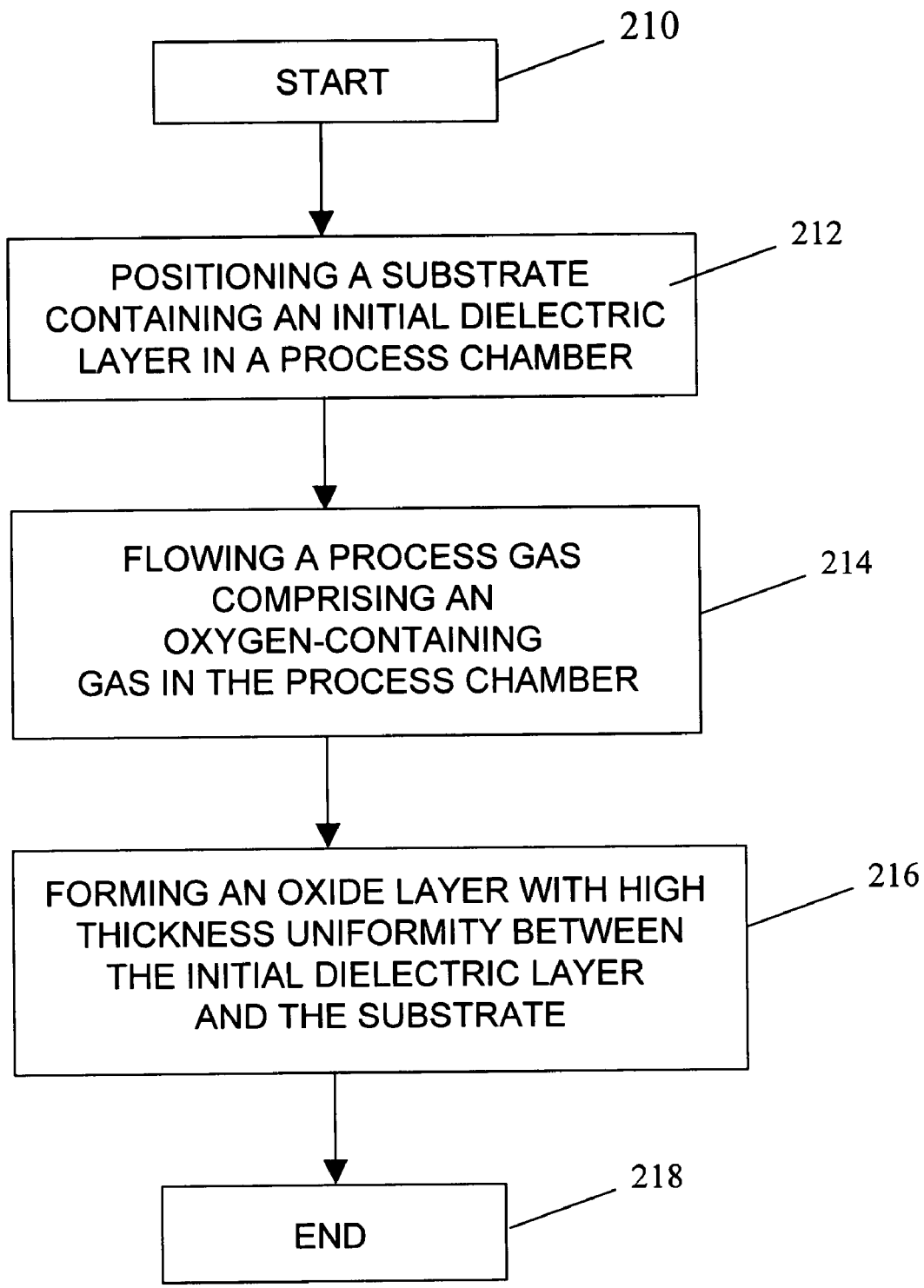
FIG. 6 shows a flowchart for forming an oxide layer according to an another embodiment of the invention.

FIG. 6 shows a flowchart for forming an oxide layer according to an alternate embodiment of the invention. At step 210, the process is started. At step 212, a substrate containing an initial dielectric layer is positioned in a process chamber and the chamber is evacuated. At step 214, a process gas comprising an oxygen-containing gas is flowed into the process chamber. At step 216 an oxide layer with uniform thickness is formed between the initial dielectric layer and the substrate in a self-limiting oxidation of the substrate. The substrate is processed for a time period that enables formation of the desired oxide layer, and the process ends at step 208. The process parameters can be as described above. Similar results were observed.

Figure 7A:
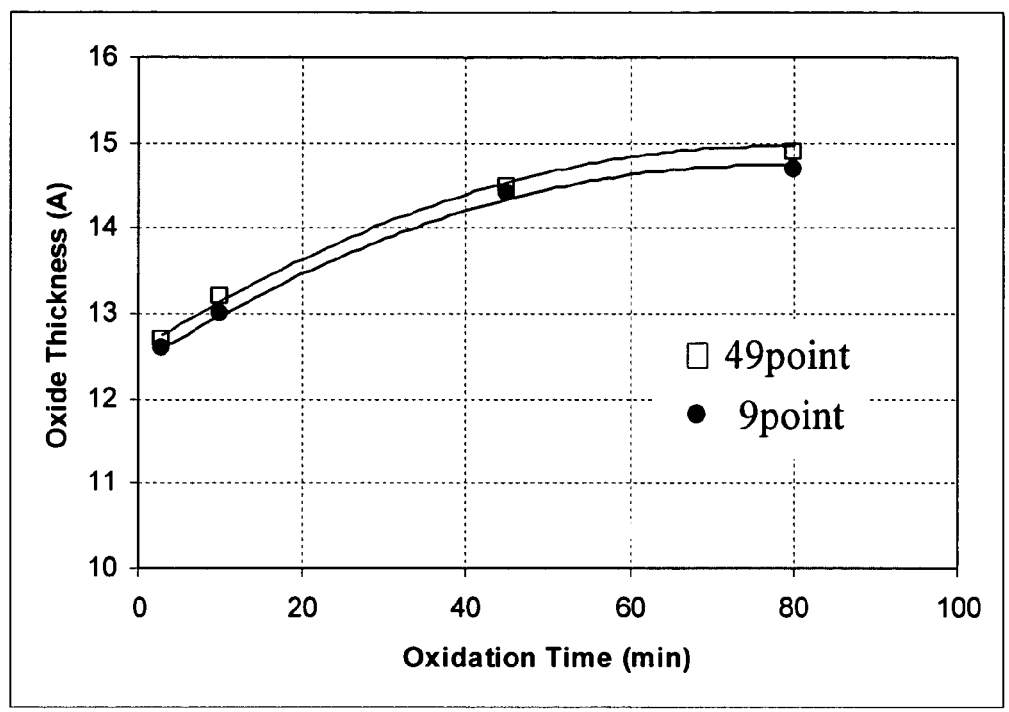
FIG. 7A shows oxide thickness versus oxidation time for oxide layers grown by a self-limiting process according to another embodiment of the present invention.

FIG. 7A shows oxide thickness versus oxidation time for oxide layers grown by a self-limiting process according to another embodiment of the present invention. Analogous to the oxide layer 102E overlying a substrate 100 shown in FIG. 5A, the starting 200 mm Si substrates (wafers) in FIG. 7A, contained chemical oxide layers that were about 10 A thick. Self-limiting oxidation of the Si substrates containing the chemical oxide layers was carried out for 3 to 80 min under low-pressure conditions. The oxidation process utilized a process gas containing an about 3:1 $N_2:O_2$ gas mixture, a process chamber pressure of about 8 Torr, and a substrate temperature of about 700° C. Typical gas flows were about 3 slm $N_2$ and about 1 slm $O_2$ in a batch type process chamber for a batch size of 100 wafers.

The oxidation curves in FIG. 7A show the average oxide thickness measured at 9 points (lower curve) and 49 points (upper curve) on the substrates using ellipsometry and a refraction index of 1.46. It is evident from FIG. 7A that the oxide growth saturates at an oxide thickness of about 15 A for these processing conditions. At each measured oxidation time (3, 10, 45, 80 min), the oxide layer thickness varied by less than about 1 A for all 49 measurement points.

Figure 7B:
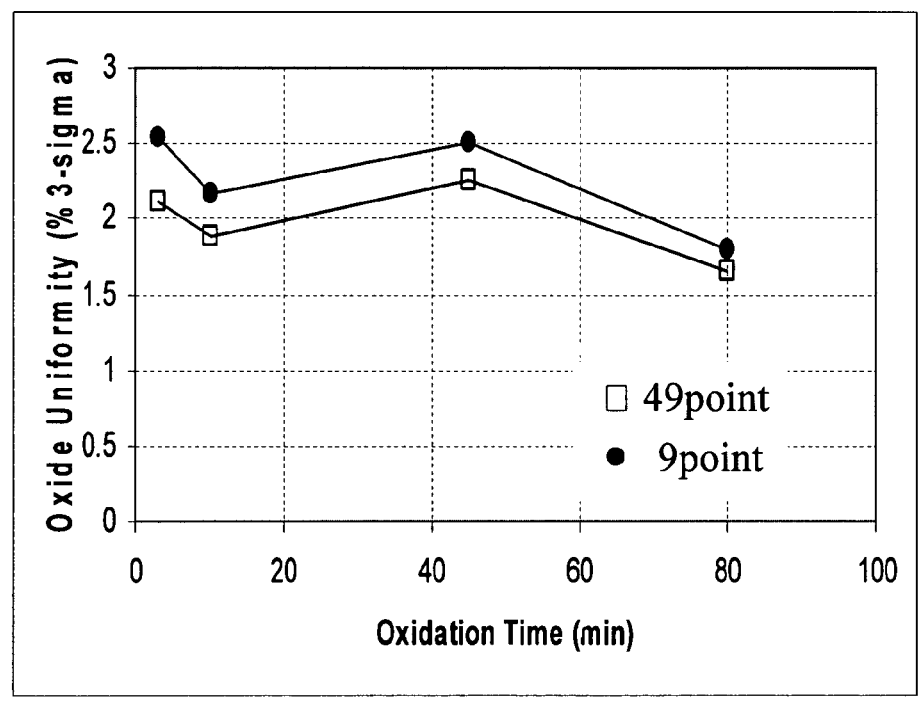
FIG. 7B shows oxide uniformity versus oxidation time for oxide layers grown by a self-limiting process according to another embodiment of the present invention.

FIG. 7B shows oxide uniformity versus oxidation time for oxide layers grown by a self-limiting process according to another embodiment of the present invention. The oxide thickness uniformity for the 9 point and 49 point measurements is shown as % 3-sigma values, and the overall trend shows improved oxide thickness uniformity over the whole Si substrate as the oxide layers grow thicker. Electrical measurements obtained for ultra-thin oxide layers (~15 A) shown in FIGS. 7A and 7B, showed good electrical properties when used as interface layers underneath high-k layers in gate electrode microstructures (see FIG. 1B).

The basic mechanism in a dry oxidation process is the diffusion of an oxidizing species through an existing oxide layer and the reaction of the oxidizing species with the substrate at the oxide/substrate interface. In a self-limiting oxidation process, the rate of oxidation decreases as the thickness of the oxide layer increases. This is likely due to hindered diffusion of the oxidizing species through the existing oxide layer to the oxide/substrate interface. In order to achieve properties of self-limiting oxidation, the oxidation ambient forms an oxidation barrier on the substrate. In FIG. 7A, only about 0.5 A of additional oxide growth is observed during the last 30 min of the 80 min self-limited process, and the self-limiting process leads to a more uniform oxide layer thickness.

In the self-limiting oxidation process, shown in FIGS. 7A and 7B, it is observed that in substrate regions that contain a relatively thin oxide layer, an oxide layer grows faster than in regions where the oxide layer is thicker. This leads to formation of oxide layers where the thickness of the oxide layer is more uniform over the whole substrate, whether the initial oxide layer is uniform or not. We believe that the slow oxide growth rate that is observed in FIGS. 7A and 7B, permits long oxidation/anneal times, and improves the electrical quality of the resulting oxide layer, by removing bulk and interface traps, when a saturated, fully oxidized, stable oxide layer is formed.

In a self-limiting oxidation process, the oxide growth rate (and the resulting final oxide layer thickness) can be reduced/increased by decreasing/increasing the oxygen partial pressure in the process gas and in the process chamber. In addition, the oxide growth rate can be reduced/increased by lowering/increasing the substrate temperature.

The oxidation data shown in FIGS. 7A and 7B, illustrates that it is possible to reproducibly grow oxide layers that are about 15 A thick, with excellent uniformity, from substrates containing oxide layers that are a few angstrom thick. The ability to start with substrates that contain an initial oxide layer (e.g., a chemical or native oxide), can remove the need to strip the initial oxide layer, prior to growing a new oxide layer on a clean substrate, as long as the initial oxide thickness is less than the desired final oxide thickness.

Semiconductor transistor technology is currently requiring oxide and oxynitride layers that are less than about 10-15 A thick for conventional gate dielectric applications (FIG. 1A), or as thin as about 5-7 A for use as dielectric interface layers with high-k materials (FIG. 1B). Formation of ultra-thin oxide layers that are thinner (<10 A) than an initial oxide layer, can require removal of at least a portion of the initial oxide layer prior to growing thinner oxide layers.

In the aforementioned process example described in FIGS. 7A and 7B, the process gas comprised $O_2$ gas and $N_2$ inert gas. Alternatively, the inert gas can comprise at least one of Ar, He, Ne, Kr, Xe. The addition of an inert gas to the process chemistry is, for example, to dilute the process gas or adjust the process gas partial pressure(s). The parameter space for the oxidation process can, for example, utilize a chamber pressure less than about 50 Torr, a process gas flow rate less than about 2000 sccm, an inert gas flow rate less than about 1000 sccm, and a substrate temperature from about 500° C. to about 1000° C. The substrate temperature can be held constant during the oxidation process or, alternatively, the substrate temperature can be ramped during the process.

Figure 8:
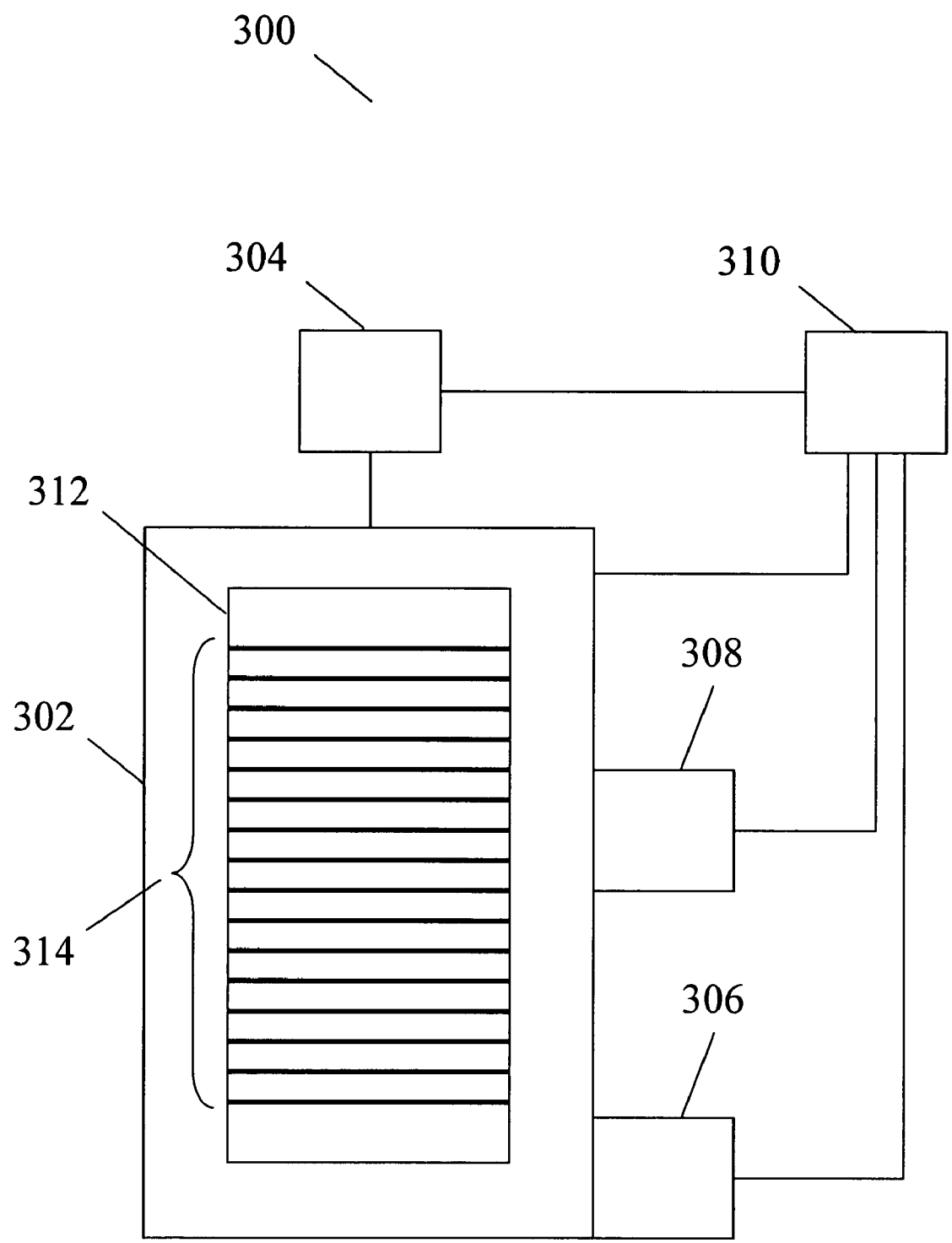
FIG. 8 shows a simplified block diagram of a processing system for forming oxide layers.

A processing system for forming ultra-thin oxide layers can comprise a batch type process chamber capable of processing multiple substrates (wafers) simultaneously. Alternatively, the processing system can comprise a single wafer process chamber. The process chamber can process any diameter substrates, such as substrates with a diameter greater than about 195 mm, such as 200 mm substrates, 300 mm substrates, or even larger substrates. A batch type process chamber can provide an advantage over single wafer process chambers by allowing long processing times for self-limiting processes FIG. 8 shows a simplified block diagram of a processing system for forming oxide layers. The batch type processing system 300 comprises a process chamber 302, a gas injection system 304, a pumping system 306, a process monitoring system 308, and a controller 310. The gas injection system 304 is used to introduce a process gas for purging, cleaning, and processing the substrates 306. Multiple substrates 314 can be loaded into the process chamber 302 and processed using substrate holder 312. A self-limiting oxidation process that is carried out in a batch type processing system, can allow for a large number of tightly stacked substrates to be processed using substrate holder 312, thereby resulting in high wafer throughput.

When carrying out a self-limiting process, it can be advantageous to load the wafers to be processed into a process chamber 302 that is at a temperature below which wafer oxidation occurs. A typical process according to the invention comprised loading the wafers to be processed into a batch type process chamber that was at a temperature of about 300° C. and comprised an ambient containing about 1% oxygen. These process conditions were effective in removing organic contamination from the substrates. In addition, several pump/purge cycles were performed using an inert gas.

Next, the process chamber temperature and process chamber pressure were adjusted to the desired values in an inert ambient to avoid substrate oxidation under non-equilibrium conditions. When the process temperature was reached, the substrates were exposed to a process gas for a time period that resulted in formation of the desired oxide layer. At the end of the oxidation process, the process chamber was evacuated and purged with an inert gas, and the substrates removed from the process chamber.

The process can be controlled by a controller 310 capable of generating control voltages sufficient to communicate and activate inputs of the processing system 300 as well as monitor outputs from the processing system 300. Moreover, the controller 310 can be coupled to and exchange information with process chamber 302, gas injection system 304, process monitoring system 308, and a vacuum pumping system 306. For example, a program stored in the memory of the controller 310 can be utilized to control the aforementioned components of the processing system 300 according to a stored process recipe. One example of controller 310 is a DELL PRECISION WORKSTATION 610™, available from Dell Corporation, Dallas, Tex.

Real-time process monitoring can be carried out using process monitoring system 308 during processing. For example, mass spectroscopy (MS) can provide qualitative and quantitative analysis of the gaseous chemical species in the process environment. Process parameters that can be monitored using MS include gas flows, gas pressure, ratios of gaseous species, and gas purities. These parameters can be correlated with prior process results and various physical properties of the oxide or oxynitride layers.

It should be understood that various modifications and variations of the present invention may be employed in practicing the invention. It is therefore to be understood that, within the scope of the appended claims, the invention may be practiced otherwise than as specifically described herein.

The invention claimed is:

1. A method of forming a semiconductor microstructure, the method comprising:

positioning a substrate containing an initial dielectric layer in a process chamber, the initial dielectric layer being at least one selected from a group consisting of a first oxide layer and a high-k layer;

flowing a process gas comprising an oxygen-containing gas in the process chamber; and forming a second oxide layer with high thickness uniformity, the second oxide layer being formed between the initial dielectric layer and the substrate in a self-limiting oxidation process, wherein the partial pressure of the oxygen-containing gas in the process chamber is less than about 50 Torr.

2. The method according to claim 1, wherein the at least one of the first and second oxide layers comprises $SiO_2$.

3. The method according to claim 1, wherein the high-k layer comprises at least one of $HfO_2$, $ZrO_2$, $Ta_2O_5$, $TiO_2$, $Al_2O_3$, and HfSiO.

4. The method according to claim 1, wherein the process chamber pressure is less than about 40 Torr.

5. The method according to claim 1, wherein the oxygen-containing gas comprises $O_2$.

6. The method according to claim 5, wherein the process gas further comprises $N_2$.

7. The method according to claim 1, wherein the process gas further comprises an inert gas.

8. The method according to claim 7, wherein the inert gas comprises at least one of Ar, He, Ne, Kr, Xe, and $N_2$.

9. The method according to claim 1, wherein the substrate temperature is between about 500° C. and about 1000° C.

10. The method according to claim 1, wherein the substrate temperature is about 700° C.

11. The method according to claim 1, wherein the process chamber pressure is less than atmospheric pressure.

12. The method according to claim 1, wherein the process chamber pressure is less than about 50 Torr.

* * * * *